United States Patent [19]

Fulton et al.

[11] 3,796,896

[45] Mar. 12, 1974

[54] TRANSISTOR LOGIC CIRCUIT

[75] Inventors: Alan William Fulton, Naperville; Ray Allen Reed, Bolingbrook, both of Ill.

[73] Assignee: Bell Telephone Laboratories, Incorporated, Murray Hill, N.J.

[22] Filed: Feb. 8, 1973

[21] Appl. No.: 330,866

[52] U.S. Cl. .................. 307/290, 307/215, 307/218

[51] Int. Cl.. H03k 3/295, H03k 19/30, H03k 19/34

[58] Field of Search ........... 307/238, 289, 290, 291, 307/292, 215, 279, 254

[56] References Cited

UNITED STATES PATENTS

| | | | |
|---|---|---|---|
| 3,621,452 | 11/1971 | Ho | 307/290 X |
| 3,238,380 | 3/1966 | Schaube | 307/289 |
| 3,324,309 | 6/1967 | Zeller, Jr. | 307/290 |
| 3,467,839 | 9/1969 | Miller | 307/289 |
| 3,529,184 | 9/1970 | Conklin | 307/291 X |
| 3,584,241 | 6/1971 | Nakamura | 307/290 |

OTHER PUBLICATIONS

Lee, "Adjustable Schmitt Trigger," IBM Tech. Discl. Bull., Vol. 12, No. 2, p. 300, 7/1969.

Moore et al., "Fast NDRO Memory Circuits for Integration," IBM Tech. Discl. Bull., Vol. 14, No. 6, p. 1666.

*Primary Examiner*—Rudolph V. Rolinec
*Assistant Examiner*—L. N. Anagnos
*Attorney, Agent, or Firm*—R. B. Ardis

[57] ABSTRACT

The logic circuit includes two transistors in a Schmitt trigger configuration in which control is exerted over the conduction state of the first transistor by input signals between its base and emitter and by positive feedback from the emitter of the second transistor to the emitter of the first transistor. Additional circuitry is connected between the emitter of the first transistor and a reference potential to decrease the switching time of this circuit by causing the conduction state of the first transistor to be controlled for a predetermined period of time by the input signals independently of feedback from the second transistor. Switching time of this circuit is further decreased by providing a differential amplifier on the outputs.

3 Claims, 2 Drawing Figures

PATENTED MAR 12 1974

3,796,896

TRANSISTOR LOGIC CIRCUIT

BACKGROUND OF THE INVENTION

This invention relates generally to transistor logic circuits and more particularly to such logic circuits employing regenerative amplitude comparison circuits.

Many logic circuits include a two-stage emitter coupled bistable transistor circuit known as a Schmitt trigger. In the transistor art, such a circuit includes a pair of transistors of like conductivity type, one regenerative feedback path intercoupling the emitter electrodes of the two transistors, and a second regenerative feedback path intercoupling the collector electrode of the first transistor and the base electrode of the second. Application of a D.C. signal pulse between the base and emitter electrodes of the first transistor causes the circuit to shift state, producing a shift in output voltage, whenever the input signal rises above a predetermined level. In this known circuit the switching of the collector-emitter path of the first transistor between the substantially conducting and substantially nonconducting states is controlled by both the input signals to this transistor and signals from the emitter of the second transistor via the second regenerative feedback path. Thus, the switching of the first transistor to the substantially conducting or substantially nonconducting state cannot be completed until the second transistor responds.

Any capacitance connected to the collector of the first transistor increases the switching time of this circuit in response to input signal transitions from high to low. This switching time increase occurs since such capacitance will hold the base of the second transistor low keeping this second transistor from changing state until this capacitance is charged. The most rapid way of charging the capacitance at the collector of the first transistor is to have the first transistor in the substantially nonconducting state. The first transistor cannot achieve the substantially nonconducting state, however, until the second transistor has changed to the substantially conducting state. Thus, capacitance at the collector of the first transistor, by keeping the second transistor from changing state, causes the circuit to be in a state which results in a slow charge of that capacitance. The effect of the capacitance at the collector of the first transistor thus multiplies itself by keeping the circuit in a state which is not the fastest state for charging that capacitance. The slowdown of switching time due to the capacitance at the collector at the first transistor is reduced to a minumum by the present invention.

SUMMARY OF THE INVENTION

In accordance with the present invention a capacitor is connected between the emitter of the first transistor in a bistable emitter-coupled trigger circuit and a reference potential to cause the conduction state of the first transistor to be controlled for a predetermined period of time by its input signals independently of the regenerative feedback from the emitter of the second transistor. This results in the charging of the capacitance at the collector of the first transistor more rapidly, thus causing the second transistor to respond to changes in input signal more rapidly.

DETAILED DESCRIPTION

Figure 1:
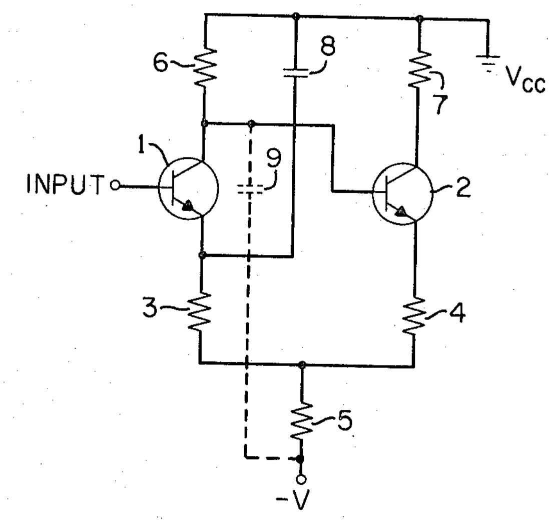
FIG. 1 is a schematic diagram of an amplitude comparison circuit employing the present invention.

The amplitude comparator, illustrated in FIG. 1, is a two-state regenerative trigger circuit containing a pair of transistors 1 and 2 of like conductivity type. These may be, for example, NPN junction transistors as indicated in FIG. 1 by the direction of the emitter arrows. The emitter electrodes of the two transistors 1 and 2 are connected via two serially connected resistors 3 and 4 to form one regenerative feedback path while the collector electrode of transistor 1 is directly connected to the base electrode of transistor 2 to form another. The junction point of the two resistors 3 and 4 is connected via a resistor 5 to the negative terminal of a D.C. voltage source. The collector electrodes of transistors 1 and 2 are connected via respective resistors 6 and 7 to the other terminal of the D.C. voltage source shown symbolically as ground. Further, the emitter electrode of the first transistor is connected to ground via a capacitor 8. The capacitance value of capacitor 8 will be described in greater detail later herein.

The following description concerns the operation of the circuit shown in FIG. 1 starting at a time when a relatively high input signal is being applied between the base of transistor 1 and the negative voltage terminal. This input signal results in transistor 1 being in the substantially conducting or ON state and transistor 2 being in the substantially nonconducting or OFF state. With the transistor 1 in the ON state its collector will be at a low potential. This low potential also appears across a capacitance 9 shown in FIG. 1 in dashed lines to represent both the stray capacitance in the circuit and any load capacitance connected to the collector of transistor 1. When the input signal to the base of transistor 1 begins to decrease, this transistor will proceed from the ON state toward a substantially nonconducting or OFF state. During this transition the current through the collector-emitter path of transistor 1 will decrease.

The voltage at the emitter of transistor 1, however, will not lower in direct response to the reduction in current from the emitter of transistor 1 due to the effect of capacitor 8. Capacitor 8 must be charged via resistors 3 and 5 before the voltage at the emitter of transistor 1 can decrease. Thus, the voltage at the emitter of transistor 1 will be controlled by the charging rate of capacitor 8. By retaining the voltage level at the emitter of transistor 1 the decreased voltage of the input signal to the base of this transistor causes this transistor to be in the OFF state before any feedback is provided from the emitter of transistor 2.

With transistor 1 in the OFF state, the current flow through it is at a minimum. With the current flow through transistor 1 at a minimum a greater supply of current is available to charge capacitance 9 through resistor 6 since little current is diverted to transistor 1 Thus, the capacitance 9 is charged more rapidly than if transistor 1 was partially conducting. Since capacitance 9 charges more rapidly the voltage at the base of transistor 2 will increase more rapidly causing this transistor to achieve the ON state sooner than if the transistor 1 were not completely in the OFF state. The increased current flow through transistor 2, due to its being in the ON state, will flow through resistors 4 and 5 and set the voltage at the emitter of the transistor 1. This voltage at the emitter of transistor 1 resulting from feedback from transistor 2 keeps transistor 1 in the OFF state until the input signal increases.

If capacitor 8 were not in the circuit when the current through transistor 1 decreased, the current through resistors 3 and 5 would directly decrease causing the voltage at the emitter of transistor 1 to decrease. Thus, without capacitor 8 the voltage at the emitter of transistor 1 would continue to decrease and this transistor could not be in the OFF state until transistor 2 went ON causing the feedback from the emitter of transistors 2 to raise the voltage level at the emitter of transistor 1.

The capacitance of capacitor 8 is just large enough to keep transistor 1 in the OFF stage until transistor 2 has gone to the ON state. This means essentially that capacitor 8 at the emitter of transistor 1 has a value to permit it to charge through resistors 3 and 5 to a voltage level just high enough to keep transistor 1 in the OFF state in approximately the same time that capacitance 9 charges through resistor 6 to a voltage level which turns transistor 2 to the ON state. Thus, the capacitance value of capacitor 8 depends upon the value of capacitance 9.

Figure 2:
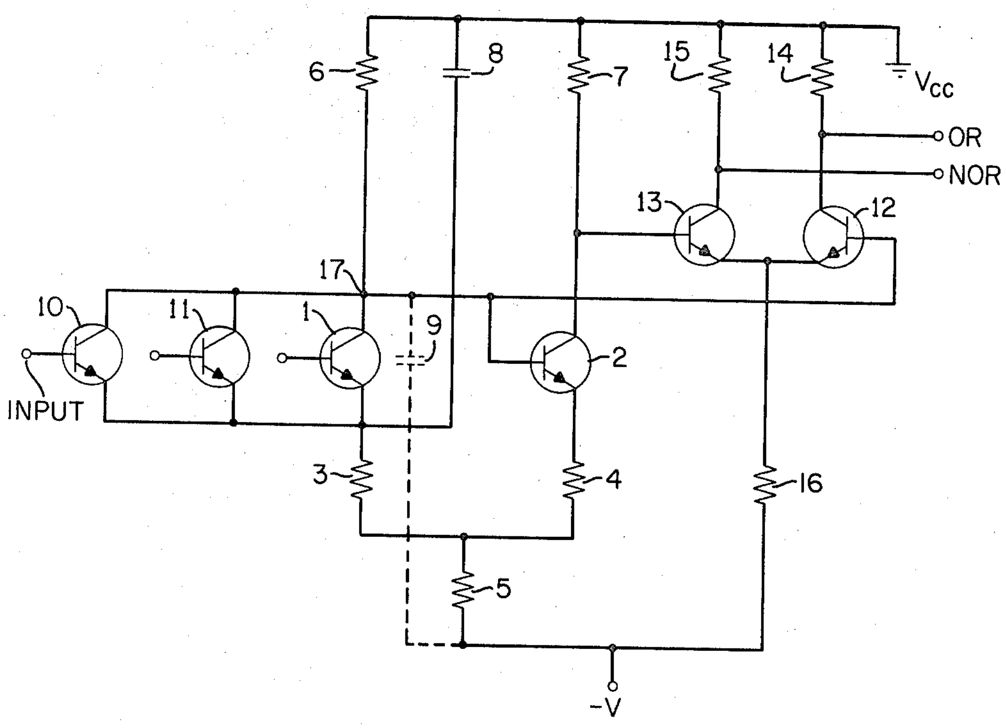
FIG. 2 is a schematic diagram of an OR-NOR logic gate employing the present invention.

FIG. 2 shows the previously described amplitude comparator as it is used for a three input OR-NOR gate. The circuit elements 1 through 9 in FIG. 2 have the same functions as the circuit elements having the same numbers shown in FIG. 1. A pair of transistors 10 and 11 are connected in parallel with the collector and emitter of transistor 1 to provide three inputs to the OR-NOR circuit. A greater number of parallel transistors may be connected to provide more inputs if desired. A point 17, which is directly connected to the collectors of each of transistors 1, 10, and 11 represents the NOR of the input signals to the circuit of FIG. 2. When one or more of the transistors 1, 10, or 11 is receiving a relatively high input signal the point 17 is at a relatively low potential. With the same input signals to the OR-NOR circuit (FIG. 2) the collector of transistor 2, which represents the OR of the inputs, will be relatively high.

In FIG. 2 point 17 is connected to both the base of transistor 2 of the amplitude comparator and to the base of a transistor 12. The collector of transistor 2 is connected directly to the base of transistor 13. Transistors 12 and 13 are connected in a differential amplifier configuration which includes respective collector resistors 14 and 15 and a common emitter resistor 16. The other terminals of the collector resistors 14 and 15 are connected to ground and the other terminal of emitter resistor 16 is connected to the negative terminal of a voltage source. Due to the inversion provided by the differential amplifer the signals at the collector of transistor 13 represent the NOR output of the circuit and the signals at the collector of transistor 12 represent the OR output of the circuit.

The differential amplifier is provided in the circuit of FIG. 2 to minimize the value of capacitance 9 and also to make its value constant. As previously stated, the value to be selected for the capacitor 8 at the emitter of the input transistor is dependent on the value of capacitance 9 at the collector of that transistor. If the value of capacitance 9 is allowed to change, then the selected value for capacitor 8 will also have to change. The transistor 12 isolates the collector of transistor 1 from any load capacitance. This results in the capacitance 9 having a constant value equal to the stray capacitance of the circuit. Since capacitance 9 is kept constant the value for capacitor 8 can be preselected and used with loads having variable or uncertain capacitance.

What is claimed is:

1. A bistable circuit comprising:

a first transistor, means to apply input signals between the base and emitter of said first transistor to control the conduction state thereof, a second transistor having its base connected to the collector of said first transistor, a positive feedback path between the emitter of said second transistor and the emitter of said first transistor for controlling the conduction state of said first transistor, and a capacitor connected between the emitter of said first transistor and a reference voltage for maintaining the voltage level at said first transistor emitter for a predetermined period of time to cause the conduction state of said first transistor to be controlled for said predetermined period of time by input signals independently of signals on said feedback path.

2. The bistable circuit in accordance with claim 1 further comprising a third and fourth transistor connected to form an emitter coupled differential amplifier, means for applying signals from the collector of said first transistor between the base and emitter of said third transistor, and means to apply signals from the collector of said second transistor between the base and emitter of said fourth transistor.

3. A logic gate comprising:

a plurality of input transistors having their collectors directly connected and their emitters directly connected, means to apply input signals between the base and emitter of each of said input transistors, a second transistor having its base connected to the collectors of said input transistors, a positive feedback path between the emitter of said second transistor and the emitters of said input transistors for controlling the conduction state of said input transistors, a capacitor connected between the emitters of said input transistors and a reference voltage for maintaining the voltage level at said input transistor emitters for a predetermined period of time to cause the conduction state of said input transistors to be controlled for said predetermined period of time by input signals independently of signals on said feedback path, a third and fourth transistor connected to form an emitter coupled differential amplifier, means for applying signals from the collector of said input transistors between the base and emitter of said third transistor, and means for applying signals from the collector of said transistor between the base and emitter of said fourth transistor.

* * * * *

UNITED STATES PATENT OFFICE
CERTIFICATE OF CORRECTION

Patent No. 3,796,896 Dated March 12, 1974

Inventor(s) Alan W. Fulton - Ray A. Reed

It is certified that error appears in the above-identified patent and that said Letters Patent are hereby corrected as shown below:

Column 3, line 18, "the OFF stage" should read --the OFF state--.

Column 4, line 64, "transistor between" should read --second transistor between--.

Signed and sealed this 23rd day of July 1974.

(SEAL)
Attest:

McCOY M. GIBSON, JR.
Attesting Officer

C. MARSHALL DANN
Commissioner of Patents